United States Patent
Rahim et al.

(10) Patent No.: US 12,174,370 B2
(45) Date of Patent: Dec. 24, 2024

(54) SYNTHESIZED APERIODIC GRATINGS AND METHOD OF MANUFACTURE

(71) Applicant: NATIONAL RESEARCH COUNCIL OF CANADA, Ottawa (CA)

(72) Inventors: Mohamed Rahim, Orleans (CA); Greg Pakulski, Woodlawn (CA); Philip Poole, Ottawa (CA); Zhenguo Lu, Ottawa (CA)

(73) Assignee: NATIONAL RESEARCH COUNCIL OF CANADA, Ottawa (CA)

( * ) Notice: Subject to any disclaimer, the term of this patent is extended or adjusted under 35 U.S.C. 154(b) by 547 days.

(21) Appl. No.: 17/611,380

(22) PCT Filed: Apr. 30, 2020

(86) PCT No.: PCT/IB2020/054092
§ 371 (c)(1),
(2) Date: Nov. 15, 2021

(87) PCT Pub. No.: WO2020/229928
PCT Pub. Date: Nov. 19, 2020

(65) Prior Publication Data
US 2022/0221715 A1    Jul. 14, 2022

Related U.S. Application Data

(60) Provisional application No. 62/848,755, filed on May 16, 2019.

(51) Int. Cl.
*G02B 27/00* (2006.01)
*H01S 5/026* (2006.01)
(Continued)

(52) U.S. Cl.
CPC .......... *G02B 27/0012* (2013.01); *H01S 5/026* (2013.01); *H01S 5/1206* (2013.01); *H01S 5/125* (2013.01); *H01S 5/1228* (2013.01)

(58) Field of Classification Search
CPC ....... H01S 5/1228; H01S 5/1206; G02B 5/18; G02B 27/0012
See application file for complete search history.

(56) References Cited

U.S. PATENT DOCUMENTS 5,329,542 A * 7/1994 Westbrook ................ H01S 5/12
372/46.01
6,141,370 A    10/2000 Avrutsky et al.
(Continued)

FOREIGN PATENT DOCUMENTS

WO    PCT/IB2020/054092    4/2020

OTHER PUBLICATIONS

Blanchard, "Gratings with an aperiodic basis: single mode emission in multiwavelength lasers," 2011, New J Phys, 13, 113023, p. 1-12. (Year: 2011).*
(Continued)

*Primary Examiner* — Michael Carter
(74) *Attorney, Agent, or Firm* — PERRY + CURRIER INC.

(57) ABSTRACT

A synthesized grating is provided comprising a substrate/layer, and a plurality of alternating aperiodic non-uniform low and high index profiles on a surface of the substrate/layer defining a transmission/reflection spectrum for one of either single or multi-frequency operation of said grating in an optical cavity. A method is also provided for designing the synthesized grating, comprising determining a grating structure of given profiles through analysis of an optimized weighted sum and mapping the grating profile to said surface with the plurality of alternating non-uniform low and high index profiles. A distributed feedback laser is also provided having top, bottom and two sides, comprising a top electrode, a cladding layer disposed below the top electrode a bottom electrode, a substrate disposed above the bottom electrode, one of either an active or passive waveguide layer,
(Continued)

a synthesized aperiodic grating layer providing distributed mirrors, and wherein the waveguide layer and synthesized aperiodic grating layer are disposed between said the substrate and cladding layer and are separated by a spacer layer.

7 Claims, 10 Drawing Sheets

(51) Int. Cl.
  *H01S 5/12* (2021.01)
  *H01S 5/125* (2006.01)

(56) References Cited

U.S. PATENT DOCUMENTS

| | | |
|---|---|---|
| 6,993,222 B2 | 1/2006 | Mears et al. |
| 2004/0208445 A1 | 10/2004 | Mears et al. |
| 2013/0077648 A1 | 3/2013 | Felder et al. |
| 2018/0011244 A1 | 1/2018 | Zhu et al. |

OTHER PUBLICATIONS

Lu, Z. G., et al. "High-performance 1.52 μm InAs/InP quantum dot distributed feedback laser." Electronics letters 47.14 (2011): 818-819.

Sarlet, Gert, et al. "Optimization of multiple exposure gratings for widely tunable lasers." IEEE Photonics Technology Letters 11.1 (1999): 21-23.

Wake, David et al. "Optical generation of millimeter-wave signals for fiber-radio systems using a dual-mode DFB semiconductor laser." IEEE Transactions on microwave Theory and Techniques 43.9 (1995): 2270-2276.

Talneau, A., C. Ougier, and S. Slempkes. "Multiwavelength grating reflectors for widely tunable laser." IEEE Photonics Technology Letters 8.4 (1996): 497-499.

Talneau, A. et al. "Superimposed Bragg gratings on semiconductor material." Electronics Letters 32.20 (1996): 1884-1885.

Blanchard, R., et al. "Gratings with an aperiodic basis: single-mode emission in multi-wavelength lasers." New Journal of Physics 13.11 (2011): 113023.

Sarlet, G. et al. "Wavelength and Mode Stabilization of Widely Tunable SG-DBR and SSG-DBR Lasers." IEEE Photonics Technology Letters 11.11 (1999): 1351.

Minier, V., "Diffraction characteristics of superimposed holographic gratings in planar optical waveguides." IEEE photonics technology letters 4.10 (1992): 1115-1118.

Othonos, A. et al, "Superimposed multiple Bragg gratings." Electronics letters 30.23 (1994): 1972-1974.

* cited by examiner

SYNTHESIZED APERIODIC GRATINGS AND METHOD OF MANUFACTURE

BACKGROUND OF THE INVENTION

1. Field of the Invention

The present invention is directed to diffraction gratings and more particularly to a synthesized aperiodic grating for waveguide devices and a method of manufacture thereof, having non-uniform low and high index profiles that can be adjusted to manipulate the transmission or reflection spectra of the grating. This type of grating, when applied to distributed feedback (DFB) lasers achieves very high side mode suppression ratio (SMSR), narrow emission line width, predetermined optical field distribution along the laser cavity and predetermined single, dual or multi-frequency operation. Application of synthetized aperiodic gratings extends to many types of waveguide devices: Distributed Bragg Reflector (DBR) lasers, Bragg filters in waveguides (such as in silicon photonics), fiber filters as well as thin film coatings.

These together with other aspects and advantages, as well as a discussion of the prior art, are more fully set forth below, reference being had to the accompanying drawings forming a part hereof, wherein like numerals refer to like parts throughout.

BRIEF DESCRIPTION OF THE DRAWINGS

FIG. 10b is a graph showing experimental measurements of optical phase noise for the InAs/InP quantum dash dual-wavelength DFB laser referred to in FIG. 10a.

FIG. 10c is a graph showing experimental measurements of optical relative intensity noise for the InAs/InP quantum dash dual-wavelength DFB laser referred to in FIG. 10a.

FIG. 10d is a graph showing experimental mm-wave signal measurements from beating of the InAs/InP quantum dash dual-wavelength DFB laser referred to in FIG. 10a.

2. Description of the Related Art

Figure 1A:
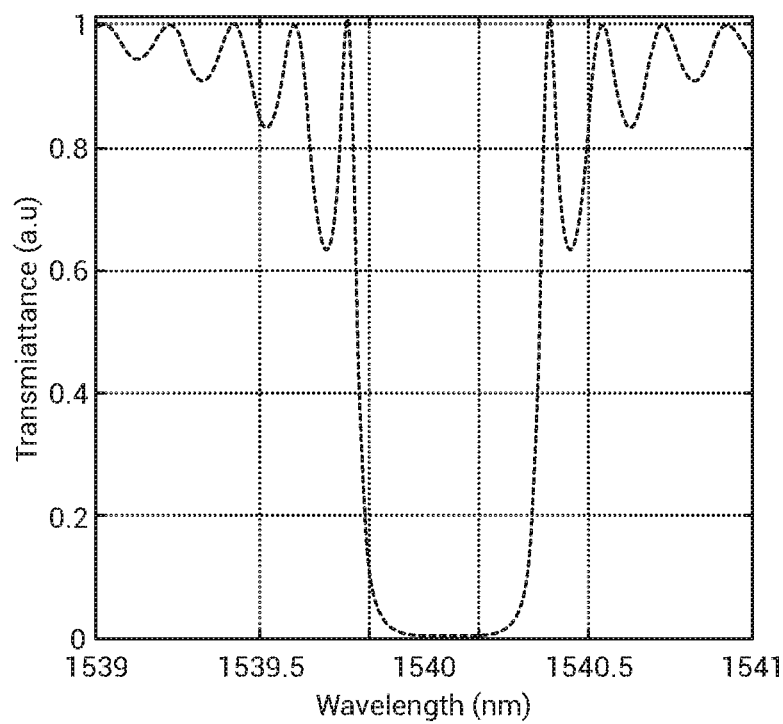
FIG. 1a illustrates a transmission spectrum of a prior art waveguide device with uniform gratings.
Figure 1B:
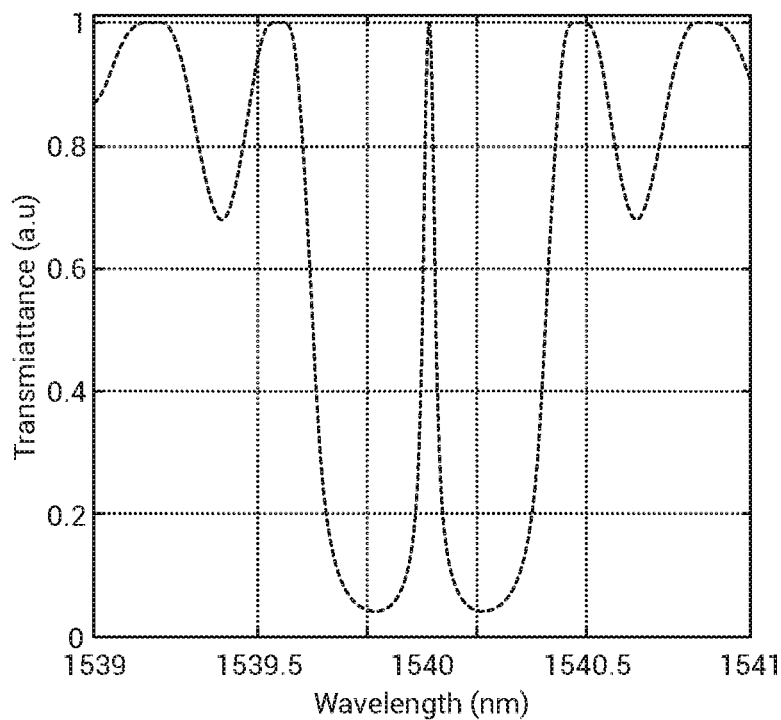
FIG. 1 b illustrates a transmission spectrum of a prior art waveguide device with uniform gratings and a $\lambda/4$ phase shift in the center of the cavity.
Figure 7A:
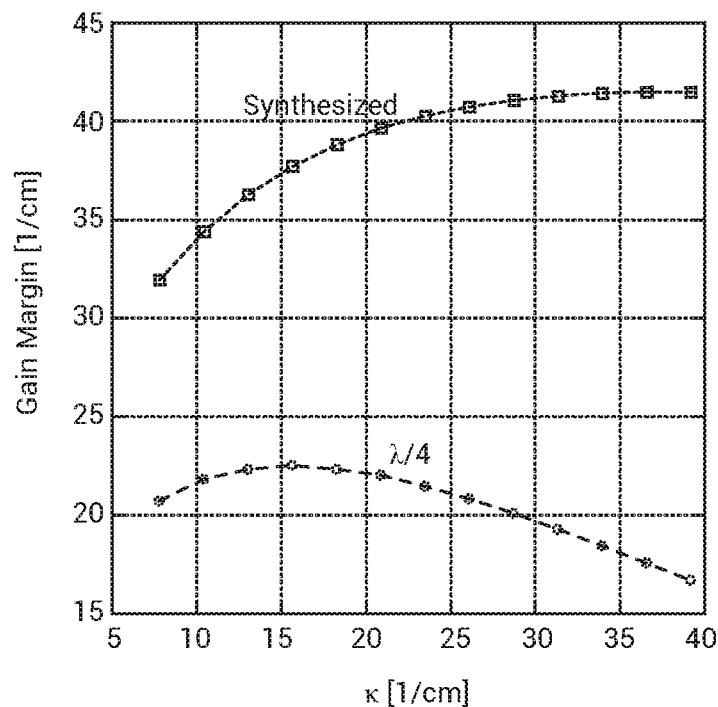
FIG. 7a is a comparison between gain margins calculated for a prior art $\lambda/4$ phase shifted grating and a synthesized aperiodic diffraction grating according to an embodiment.
Figure 7B:
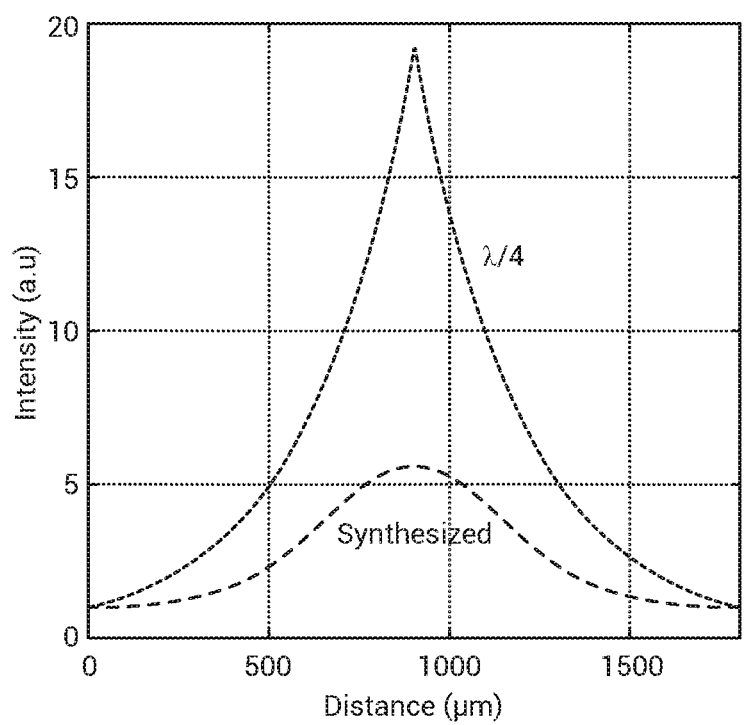
FIG. 7b is a comparison between intensity distributions calculated for a prior art $\lambda/4$ phase shifted grating and a synthesized aperiodic diffraction grating according to an embodiment.

Modern distributed feedback waveguide devices require high quality diffraction gratings. These devices can be DFB lasers, Bragg reflector lasers or filters. DFB lasers lase at or near transmission peaks, whereas DBR lasers lase at or around reflection peaks of the reflector. High quality of gratings for these applications is characterized by the absence of spurious features around the transmission or reflection peaks of interest in the spectra. A simple uniform waveguide Bragg grating transmission spectrum has two main peaks at the edges of the Bragg stop-band and undesired additional peaks outside of these edges as shown in Figure Ia. Each of these peaks, when provided with enough gain, can start a longitudinal lasing mode, which can be undesirable if single longitudinal mode operation of the DFB device is required. FIG. 1b illustrates a transmission spectrum of a prior art waveguide device with uniform gratings and a $\lambda/4$ phase shift in the center of the cavity, as discussed in greater detail below. Optical intensity distribution along the laser cavity with a $\lambda/4$ phase shifted grating is shown in FIG. 7b (top trace), discussed below.

To suppress these undesired peaks, a special design of grating is necessary. In the case of DBR lasers where lasing takes place at or near reflection peaks of the Bragg reflector, undesired reflection peaks must be suppressed. Similar considerations are applicable to grating filters. On the other hand, if dual or multi-wavelength operation is required the transmission peaks must have equal threshold current (not necessarily equal threshold gain).

DFB lasers utilize Bragg gratings, which are a well-known form of diffraction grating characterized by the ability to reflect select wavelengths of light while transmitting select others. This is usually achieved by creating a periodic variation in the refractive index in the vicinity of the active layer or even within the active layer. The fundamental principle behind the operation of a Bragg grating is Fresnel reflection, where light traveling between media of different refractive indices partially reflects at each of the low index-high index and high index-low index interfaces. In a DFB laser the refractive index typically alternates over the entire length of the laser cavity.

In an index coupled DFB laser, according to the prior art structure of FIG. 4a, Bragg grating 140 can be formed above or below the active waveguide layer 120 which can be formed as a bulk semiconductor layer, multiple quantum wells or multiple quantum dot/dash layers. The grating 140 is usually separated from the active layer by a thin spacer layer 130. The laser structure is grown on a substrate 110 and is fitted with a bottom electrical contact 100, and top electrical contact 160, and a cladding layer, 150. The waveguide is terminated by front and back facets. If the grating is periodic and continuous, and the facets of the laser are anti-reflection (AR/AR) coated, such that there is no feedback other than from the grating, then the device supports two longitudinal (degenerate) modes which may or may not oscillate simultaneously. The transmission spectrum of the uniform grating laser below threshold with both facets AR coated is shown in FIG. 1a, discussed above. If degeneracy is not desired, it is known in the prior art to introduce a quarter-wave shift in the grating. A quarter wave shifted grating layer 141 is shown in FIG. 4b. This quarter-wave phase-shift creates two side-by-side Bragg "stop-bands" as shown in FIG. 1b. The laser then lases near the transmission maximum common to both stop-bands and can be very stable. Nevertheless, when the coupling coefficient of the grating is too high or when the injection is high, even in the case of a quarter wave phase shifted DFB laser, this stability is not guaranteed. Under these conditions, the total intra-cavity intensity peaks at the phase shift region (see FIG. 7b, top trace). As a consequence, gain saturation at and near the phase shift leads to significant local changes in the carrier density which in turn changes the refractive index locally through photon-carrier coupling, known as spatial hole burning. Spatial hole burning can dramatically affect gain margin. To remedy this, rather than a single quarter-wave phase shift near the center of the cavity, dual or multiple smaller phase shifts may be introduced into the grating to make mode intensity more uniform and further improve laser stability.

Other methods of modal stabilization of the index coupled DFB lasers are known in the prior art: grating period modulation, effective index modulation and cleaved/AR or HR/AR coating, to name a few. The cleaved/AR (Anti-Reflection) or HR/AR (High-Reflection/Anti-Reflection) coating method for modal selection and stabilization is especially challenging. During the manufacturing of such DFB lasers, the cleaved or HR coated facets are positioned randomly relative to the grating, i.e. the facet may land at the crest or at the groove of the grating or anywhere in-between. This uncertainty lowers the single mode yield of DFB lasers and affects laser stability, threshold and efficiency. This type of lasers must be pre-selected for modal stability.

In addition to index coupling for modal selection and modal stabilization, gain and loss coupling methods are known in the art. These methods are not discussed in detail herein, although the methods of grating design set forth below are applicable to gain/loss coupled DFB devices as well.

Several aspects of grating design are discussed in prior art publications (patents and papers) some of which are listed below. Earlier papers suggest superposition of stopbands in the photoresist through multiple exposures, (see, for example, *Optimization of Multiple Exposure Gratings for Widely Tunable Laser*, by G. Sarlet et al, IEEE Photonics Technology Letters, VOL. 11, NO. 1, JANUARY 1999). These publications concentrate mostly on introduction of desired features in the resulting grating spectrum, (see, for example, Avrutsky et al, U.S. Pat. No. 6,141,370; Mears et al, U.S. Pat. No. 6,993,222, (and references therein)) but none of them mentions suppression of unwanted (spurious) features in the resulting spectra or use of iteration methods to achieve particular performance of a device utilizing these gratings.

Other relevant prior art publications include:

*Multiwavelength Grating Reflectors for Widely Tunable Laser*, by A. Talneau et al, IEEE Photonics Technology Letters, VOL. 8, NO. 4, APRIL 1996

*Superimposed Bragg Gratings on Semiconductor Material*, by A. Talneau et al, Electronics Letters (Volume: 32, Issue: 20, 26 Sept. 1996)

*Diffraction Characteristics of Superimposed Holographic Gratings in Planar Optical Waveguides*, by V. Minier et al., IEEE Photonics Technology Letters, VOL. 4, NO. 10, OCTOBER 1992

*Gratings with an aperiodic basis: single-mode emission in multi-wavelength lasers*, by B. Blanchard et al, New Journal of Physics 13 (2011) 113023

*Superimposed multiple Bragg gratings*, by A. Othonos et al, Electronics Letters 10th November 1994, Vol. 30 No. 23

US 2018/0011244 (Zhu et al), published Jan. 11, 2018

US 2013/0077648 (Felder et al), published Mar. 28, 2013

SUMMARY OF THE INVENTION

According to an aspect of the present specification, a synthesized aperiodic grating is set forth and a method of manufacture thereof, having particular application to the manufacture of multiwavelength DFB lasers in a single cavity. The aperiodic grating set forth herein has a variable period limited only by the resolution of the fabrication method. The length of each low or high index section of the grating can be adjusted to manipulate the transmission/reflection spectrum of the device. An iterative technique is set forth to yield a close approximation of the desired/designed reflection/transmission spectrum where the emission wavelengths are freely selectable and may be accurately controlled to produce single, multiple or overlapping stop-bands and transmission peaks. The stop bands and transmission peaks can further be shaped to suppress all unwanted ripples in the spectrum that may form potential laser modes. Therefore, the emission wavelengths are freely selectable and accurately controlled by the synthetized aperiodic grating set forth herein.

The synthesized aperiodic grating discussed herein has commercial applications in such diverse fields as telecommunications, sensing, spectroscopy and photonic microwave generation, as well as more specific applications such as: fabrication of multiple wavelength lasers in a single cavity length; high side-mode suppression ratio in DFB lasers; high production yield of high SMSR single mode DFB lasers;

narrow linewidth lasers; high production yield multi wavelength laser arrays; controlling the grating effective coupling coefficient in Bragg waveguides; multi-wavelength optical filters; and fabrication of dual wavelength lasers to generate ultrahigh frequency electrical oscillations in the GHz to THz range.

Figure 4A:
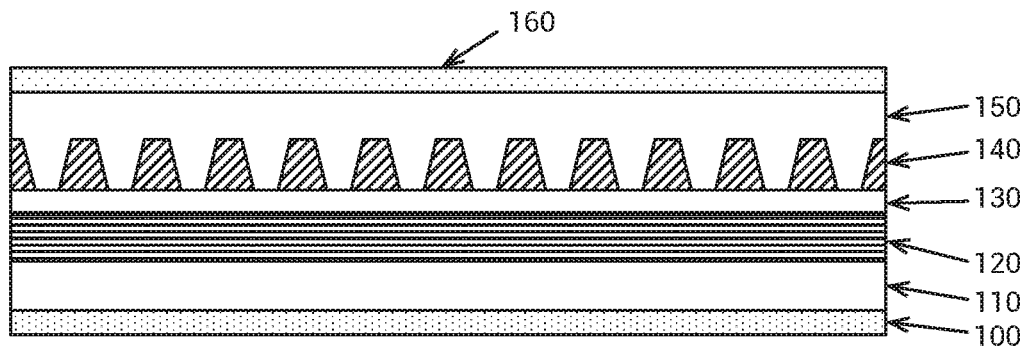
FIG. 4a is a cross-section view through a portion of a top periodic grating according to the prior art, with trapezoidal low index grating profile.
Figure 4B:
FIG. 4b is a simplified illustration of a a/4 phase shifted DFB grating layer, according to the prior art.

Unlike the prior art grating of FIGS. 4a and 4b, which is periodic and continuous in nature, the synthesized grating set forth herein includes a plurality of alternating non-uniform low and high profiles that are aperiodic within the optical cavity.

According to one aspect, a synthesized grating is provided comprising a substrate/layer; and a plurality of alternating aperiodic non-uniform low and high index profiles on a surface of said substrate/layer defining a transmission/reflection spectrum for one of either single or multi-frequency operation of said grating in an optical cavity.

According to another aspect, a method is provided for designing the synthesized grating set forth above, comprising: determining a grating structure of given profiles through analysis of an optimized weighted sum; and mapping the grating profile to said surface with said plurality of alternating non-uniform low and high index profiles.

According to another aspect, a distributed feedback laser is provided having top, bottom and two sides, comprising: a top electrode; a cladding layer disposed below the top electrode a bottom electrode; a substrate disposed above the bottom electrode; one of either an active or passive waveguide layer; a synthesized aperiodic grating layer providing distributed mirrors; and wherein said waveguide layer and synthesized aperiodic grating layer are disposed between said substrate and cladding layer and are separated by a spacer layer.

According to yet another aspect, a use is provided of the synthesized aperiodic grating set forth above to fabricate a quantum dash or quantum dot dual-wavelength distributed feedback (DFB) laser for generating high performance millimeter-wave (MMW) signals with a frequency range from approximately 10 GHz to approximately 1 THz.

DETAILED DESCRIPTION OF THE PREFERRED EMBODIMENTS

Figure 5A:
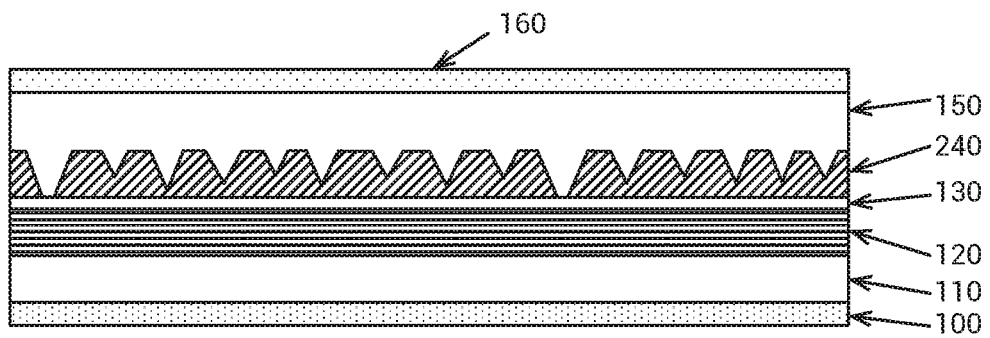
FIG. 5a is a cross-section view through a portion of a DFB laser having a top synthesized aperiodic grating according to an exemplary embodiment, with a triangular/trapezoidal low index grating profile.
Figure 5B:
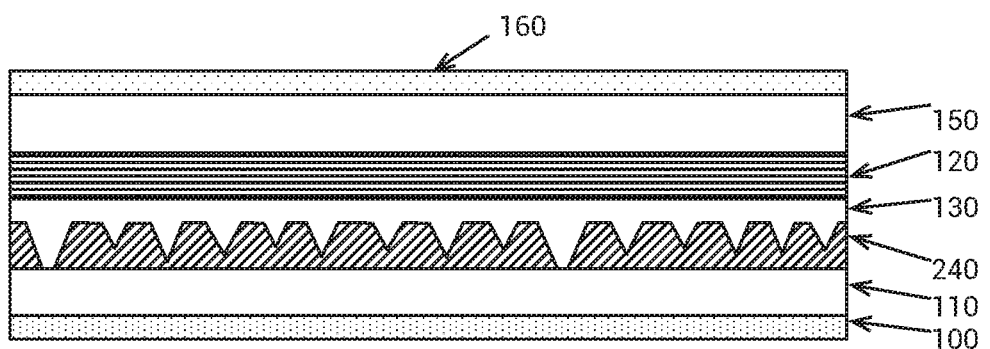
FIG. 5b is a cross-section view through a portion of a DFB laser having a bottom synthesized aperiodic diffraction grating according to a further exemplary embodiment, with a triangular/trapezoidal low index grating profile.

FIGS. 5a and 5b show simplified representations of DFB lasers according to exemplary embodiments, with a synthesized aperiodic grating layer above the waveguide, FIG. 5a, and below the waveguide, Figure 5b. These representations comprise a bottom electrode 100, substrate 110, spacer 130, cladding 150, top electrode 160, an active or passive waveguide layer 120, and a synthesized aperiodic diffraction grating layer 240 that provides distributed feedback. The waveguide layer 120 can comprise one of either quantum wells, quantum dots, quantum wires or quantum dashes, and can be fabricated from inhomogeneous gain material, such as InAs/InP.

The diffraction grating 240 is created using any suitable fabrication method for creating a desired physical profile that results in a desired refractive index profile. For example, the grating can be fabricated by "writing" a desired grating pattern into a photoresist deposited onto a grating layer or layers using electron beam lithography. The photoresist may then be developed and hardened and used as a mask for etching the actual grating pattern. Depending on the etching chemistry and etching method, the grating groove can attain various shapes. In fact, in general such grating grooves can be of arbitrary shape, but more common forms are triangular, trapezoidal, semicircular, paraboloid etc. The grating crests are usually flat. After regrowth of such a grating with a material of lower refractive index than the index of the grating layer an aperiodic variation of the refractive index is created. The grating layer or layers can be positioned above or below the active or passive waveguides or can be directly within the waveguide layer 120. In simple terms, the diffraction grating 240 is designed by selecting a desired spectral shape and using an iterative method to generate a grating profile that provides the required aperiodic variation of the refractive index along the length of the cavity to achieve required properties in the DFB device.

This aperiodic variation of the refractive index is designed with the help of an intermediate function F(x) of multiple wavelengths, $\Lambda_i$, i=0 ... N, where x ranges along the entire length, L, of the grating structure 240, as follows:

$$F(x) = \sum_i A_i M_i(x) T(\lambda_i, x), i = 0 \ldots N,$$

where $A_i$ represents the amplitudes, $T(\lambda_i, x)$ is a continuously varying periodic function along, x.

A trivial example is a simple cosine function:

$$T(\lambda, x) = \cos\left(\frac{2\pi(x - 0.5L)}{\Lambda_i}\right).$$

For this, a periodic triangular wave function is preferred:

$$T(\lambda_i, x) = 4\left|\frac{x - 0.5L}{\Lambda_i} - \left\lfloor\frac{x - 0.5L}{\Lambda_i}\right\rfloor - 0.5\right| - 1,$$

$$x = 0 \ldots L, \text{ and where } \Lambda_i = \frac{m\lambda_i}{2n_e}$$

is a period of the triangular wave $T(\lambda_i, x)$, $n_e$ is an effective index of the device waveguide and m represents the grating order. $M_i(x)$ is a slowly varying amplitude modulation function. Symbol $\lfloor x \rfloor$ denotes a floor function of x. Thus, the function F(x) is a sum of slowly amplitude modulated triangular waves.

It should be noted that the function F(x) applies to any shape of index profile, however its final form is obtained through iteration, as discussed in greater detail below. The values of this function along x are proportional to the distribution of the refractive index in the device cavity and form a grating with spectral features occurring at vacuum wavelengths $\lambda_i$. However, reproducing the index distribution, or index profile, predicted by the function F(x) is in most cases impossible because prior art etching methods are not capable of reproducing it. Therefore, according to an aspect of this specification, in order to realize/use index profiles such as v-grooves, trapezoids, half circles and the like, all of which are achievable by different etching and re-growth techniques, the function F(x) is analyzed such that wherever there is a continuous span where F(x) is ≥0, a realistic high index profile, PH, is assigned and a realistic low index profile, PL, is assigned wherever there is a continuous span where F(x) is <0. In this way a non-uniform index synthesized grating of length L can be created, as discussed in greater detail with reference to FIG. 9. It should be noted that the gratings are almost always etched into the grating layer such that the effective index of the waveguide is reduced compared to the index of the waveguide without gratings, which must be taken into account in the design and optimization of the grating.

A simple example of a synthesized grating for application in single mode DFB laser according to an embodiment, utilizes a function F(x) of a form:

$$F(x) = T(\lambda_0, x) + 0.5T(\lambda_1, x);$$

$$M(x) = 1, \lambda_0 = 1540 \text{ nm}, \lambda_1 = 1540.24 \text{ nm}, L = 1.8 \text{ mm}$$

Figure 2A:
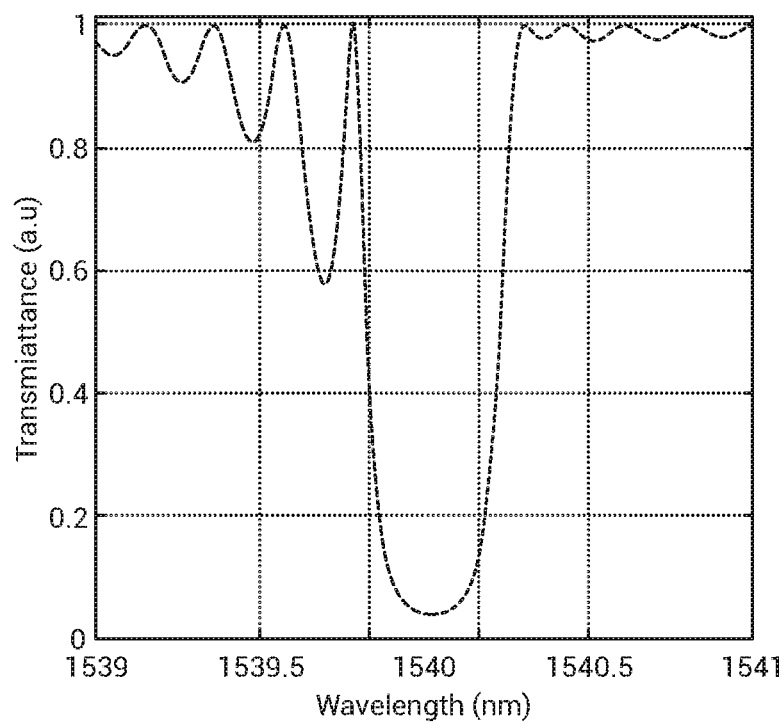
FIG. 2a illustrates the transmission spectrum of a synthesized aperiodic diffraction grating according to an embodiment, with one major stop-band and one additional minor stop-band to suppress spectrum peaking at the long wavelength side of the stop-band.

The resulting transmission spectrum of thus synthesized trapezoidal grating is shown in FIG. 2a.

Figure 2B:
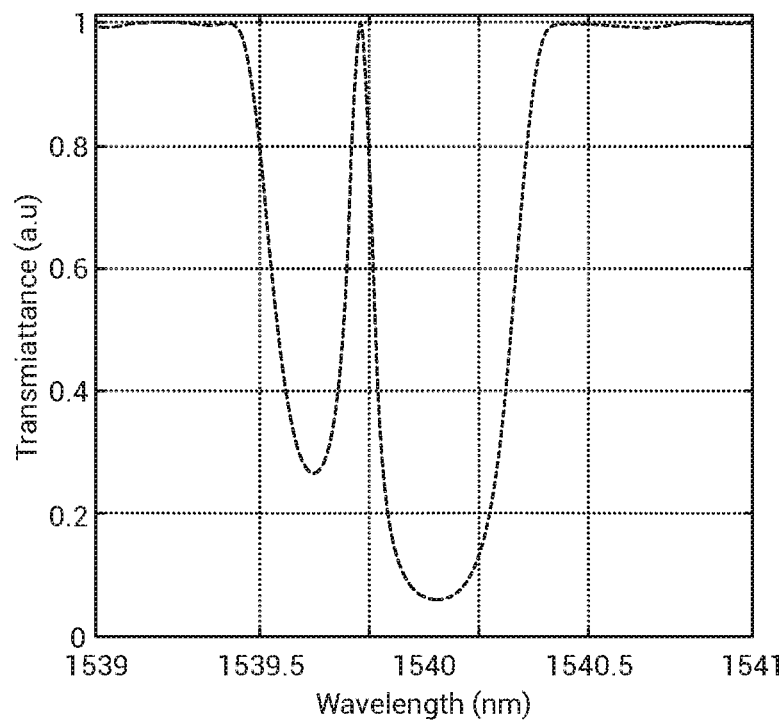
FIG. 2b illustrates the transmission spectrum of a synthesized aperiodic diffraction grating according to another embodiment, with one major stop-band and five additional minor stop-bands to suppress unwanted spectral features and enhance the desired transmission peak.

In the resulting grating, the short wavelength side of the dominant Bragg stop band has the lowest threshold gain. However, as noted in FIG. 2a, significant oscillations remain in the transmission spectrum at even shorter wavelengths. The transmission peaks associated with these oscillations can still form unwanted lasing modes at high values of feedback. This is alleviated according to the invention, by adding weaker stop bands to function F(x) on the short wavelength side. Finally, by adding an extra stop band strongly detuned from the major stop-band, a grating is created with the resulting transmission spectrum shown in FIG. 2b. A DFB laser equipped with such grating structure is very resilient to over-coupling. A comparison of gain margins/intensity distributions for a laser with the resulting synthesized gratings according to an aspect of the invention and a simple prior art λ/4 DFB laser is presented in FIG. 7. It will be noted that the synthesized aperiodic grating design suppresses transmission oscillations at the sides of the transmission peak.

Figure 6A:
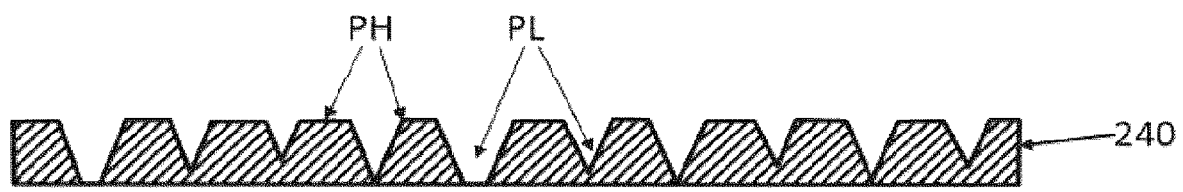
FIG. 6a is a cross-section view through a portion of a synthesized aperiodic diffraction grating layer according to an exemplary embodiment, with a triangular (V-groove) low index grating profile.

FIG. 6a shows a portion (not to scale) of the exemplary synthesized aperiodic grating 240 (synthesized Bragg grating). The grating 240 is formed on a grating layer and is characterized by a flat high index profile, PH, for providing a constant refractive index, and a groove etching profile of the grating which, in the illustrated embodiment comprises a triangular (V-groove) low index profile, PL, resulting in a grating 240 that is non-uniform in terms of the width of the PH and PL sections as well as the depth of the groove in the PL section. In other embodiments, the low index profile, PL can be trapezoidal (FIG. 6b) or half circular (FIG. 6c). In general, both profiles, PH and PL, can be of arbitrary shape and can include a combination of differently shaped profiles.

As discussed above, the aperiodic grating 240 may be used, among other applications, in single cavity multiple wavelength lasers such as DFB lasers for generating ultrahigh frequency electrical oscillations in the GHz to THz range useful for 5G/5G+ cellular communications.

Figure 6B:
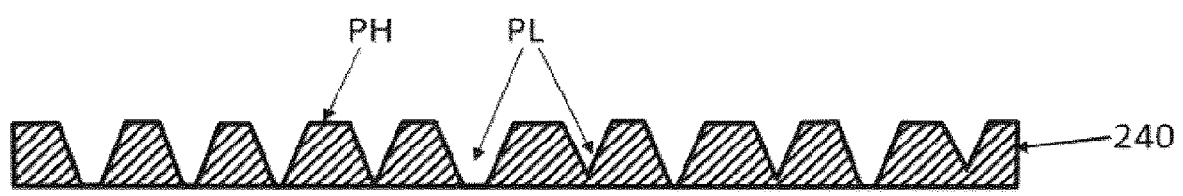
FIG. 6b is a cross-section view through a portion of an aperiodic diffraction grating layer according to an exemplary embodiment, with a trapezoidal low index grating profile.
Figure 6C:
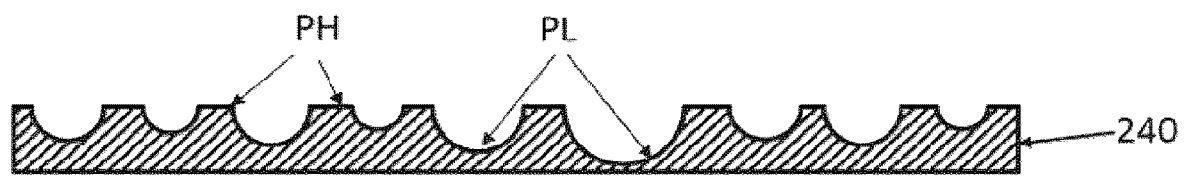
FIG. 6c is a cross-section view through a portion of an aperiodic diffraction grating layer according to an exemplary embodiment, with a half-circular low index grating profile.

The aperiodic grating of FIGS. 6a, 6b or 6c can be designed and manufactured in such a way as to produce multiple single or overlapping stop-bands. The stop bands or the edges of the stop-bands can further be shaped to suppress all unwanted oscillations which maxima can form potential laser modes. Thus, the emission wavelengths are freely selectable and may be accurately controlled by introducing more stopbands than the number of desired transmission or reflection peaks. In general, many stop-bands can be used for suppressing unwanted features in the spectra, including "ghost" stop-bands, far removed from the wavelengths of interest.

Figure 3A:
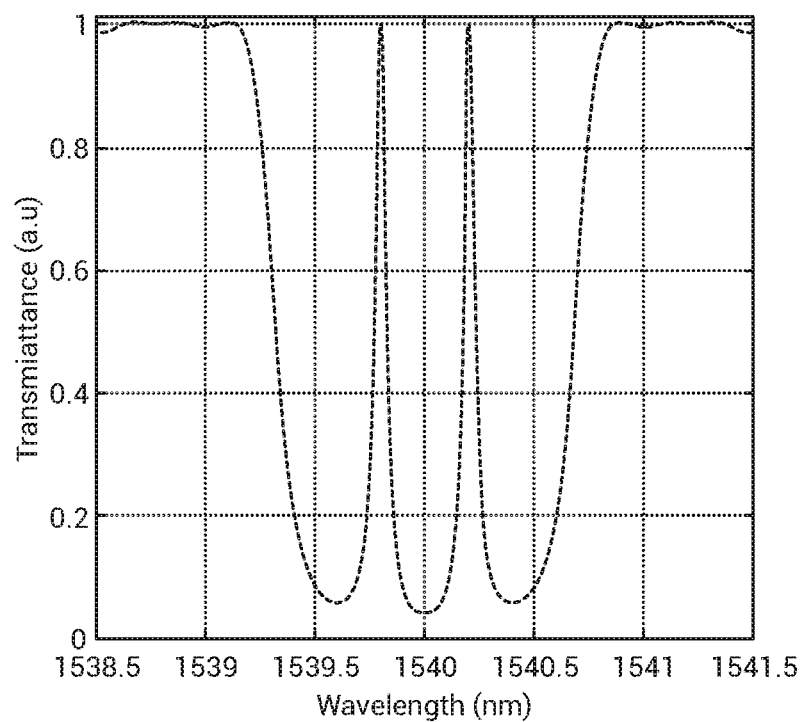
FIG. 3a illustrates the reflection spectrum of a DFB laser incorporating a synthesized aperiodic diffraction grating according to another embodiment, wherein three stop bands are generated and manipulated to produce only two modes with a 50 GHz separation.

FIG. 3a shows the transmission spectrum of a DFB laser incorporating an aperiodic grating 240, wherein three stop bands are generated and manipulated to produce only two modes with a 50 GHz separation.

Figure 3B:
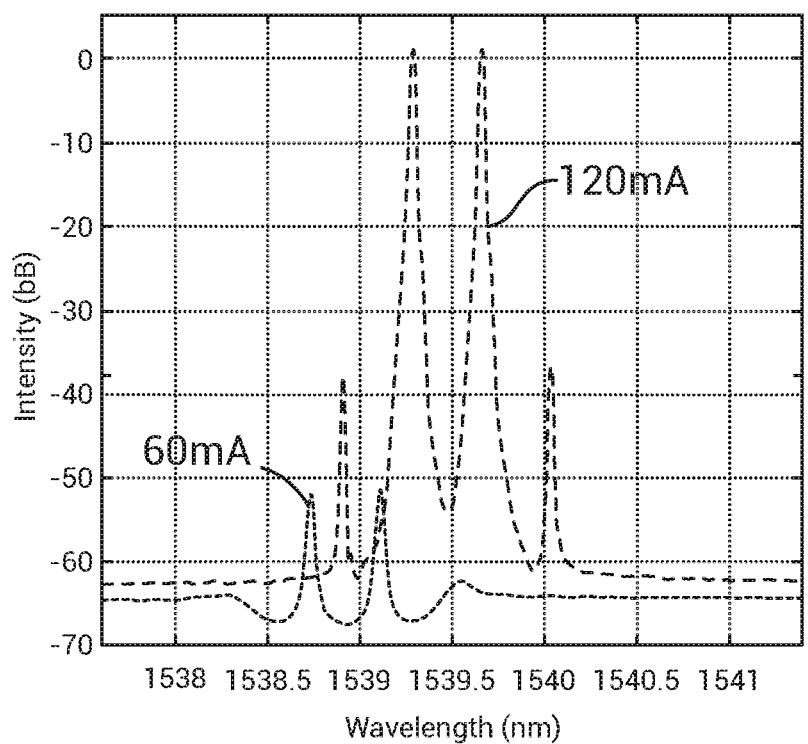
FIG. 3b shows the emission spectrum of a DFB quantum dot laser incorporating the synthesized aperiodic diffraction grating with transmission spectrum of FIG. 3a, operating in two modes with 47 GHz separation.

FIG. 3b shows the emission spectrum of a DFB quantum dot laser incorporating an aperiodic grating 240, fabricated with e-beam lithography, followed by wet etching, as discussed in greater detail below with reference to FIG. 9. The laser has two modes with 47 GHz separation. At threshold, 60 mA trace, there are only two modes of equal intensity visible. Above threshold, at 200 mA, the two principal modes continue to be of equal intensity. The two side-modes of lower intensity are the product of four wave mixing between the two principal modes.

Figure 8:
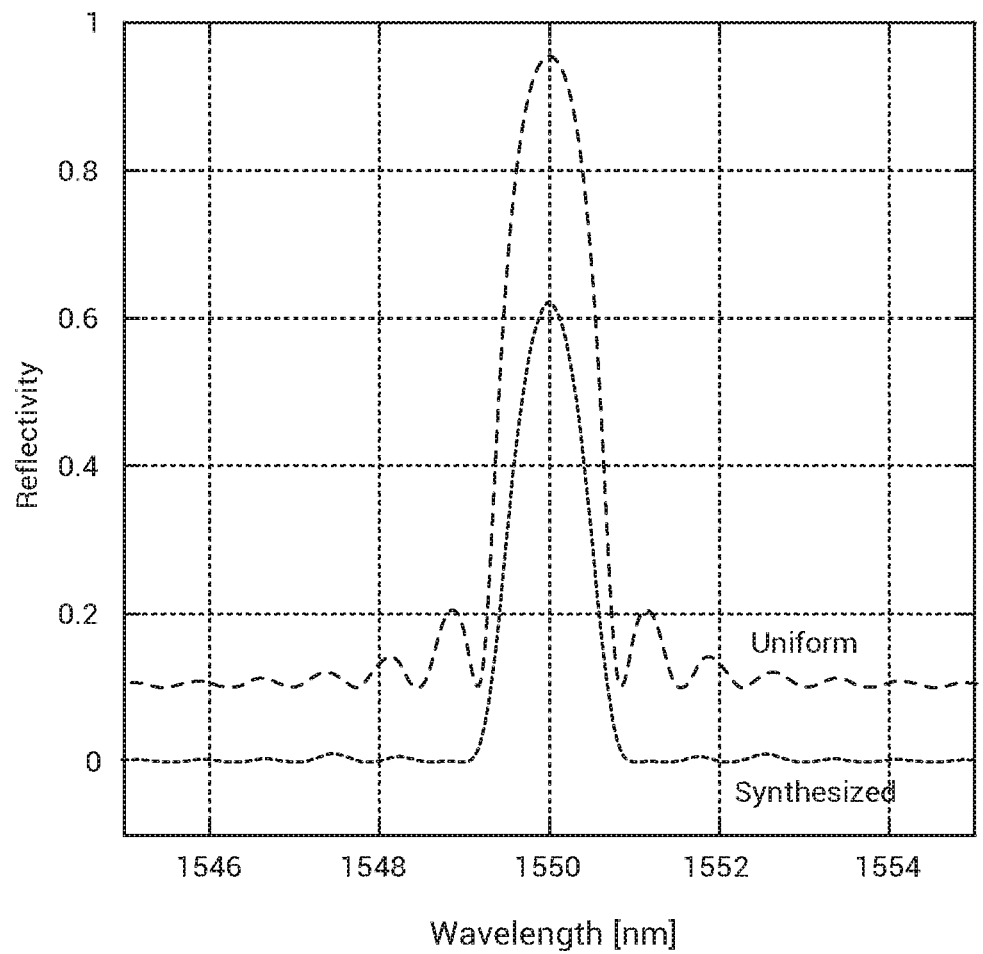
FIG. 8 is a comparison between the reflection spectra of a Bragg reflector incorporating a uniform grating according to the prior art and the synthesized aperiodic diffraction grating according to an embodiment.

The effect of reflection spectrum optimization using the above method is shown in FIG. 8. The upper trace (shifted upwards for clarity) shows the reflection spectrum of a Bragg reflector incorporating uniform grating. The optimized synthesized aperiodic grating design incorporates four wavelengths in the intermediate function: The main wavelength is positioned at 1550 nm, two wavelengths at the sides of the main stopband and an additional "ghost" wavelength strongly detuned from the main stop band. It can be seen that the optimized design suppresses reflectivity oscillations at the sides of the main reflection peak.

Figure 9:
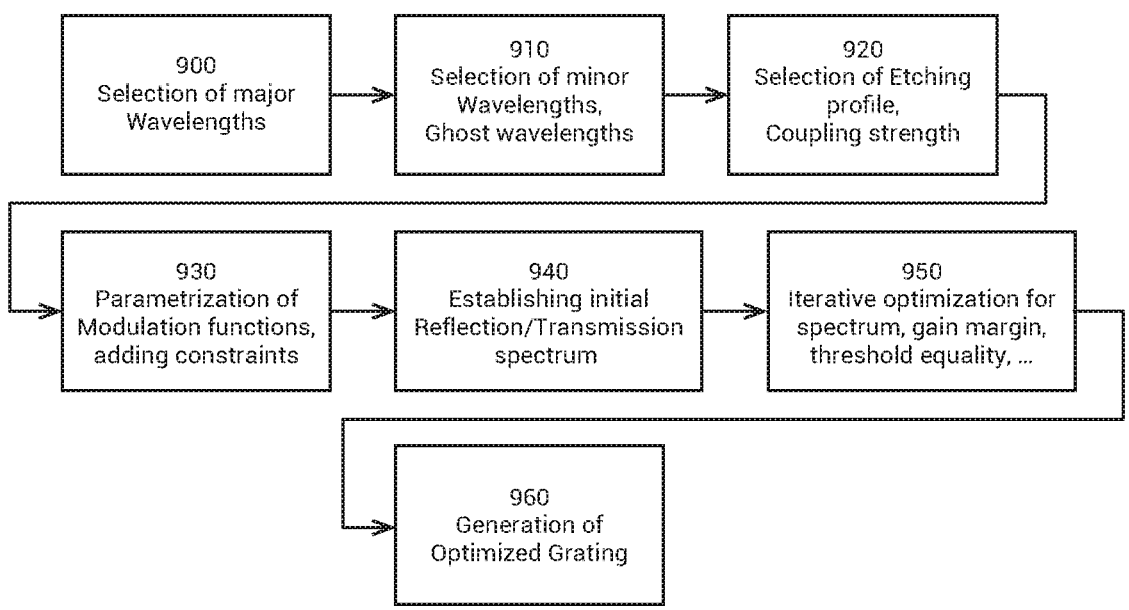
FIG. 9 is a flowchart showing a method of designing and manufacturing an aperiodic diffraction grating, according to an aspect of the invention.

The aperiodic grating 240 can be created with a desired refractive index distribution using an iterative transfer matrix method, with reference to FIG. 9. First, at 900, the number of major wavelengths $\lambda_i$, used in function F(x), is selected depending on factors, such as single vs. dual mode or multimode operation. The respective triangular waves are chosen with amplitudes, $A_i$, close to 1.0 and to determine the number of desired/visible Bragg stop-bands in the spectrum. Additional wavelengths and their respective amplitudes, usually smaller than 1.0, are used to suppress reflection or transmission oscillations on the sides of dominant Bragg stop-bands, 910. The number of these wavelengths and their amplitudes depend on desired threshold gain difference (for single mode lasers), threshold gain equality or threshold current equality (for dual or multimode lasers), longitudinal photon distribution in the cavity, mode separation, etc. Slowly varying amplitude modulation function M(x) in simple cases can be equal to 1. However, if very high side mode suppression, very low linewidth or special field distribution along the cavity is desired, this function can become a raised cosine, parabolic or step up-step down function, to name a few.

After initial selection of the values for 1, and respective amplitudes, $A_i$, at 920, the etching profile is selected based on the etching chemistry and etching technique available or preferred if a selection is available.

At 930, constraints are added, e.g. minimum and maximum size of PL and PH profiles lengths. The function also has to be parametrized and the parameters added to the iteration values: ($p_0$, $p_1$, $p_2$, ). An example of the M(x) function is:

$$M(x) = 0.5(1 - \cos(2\Pi(x - p0)/p1)).$$

An approximate desired reflection spectrum is calculated at 940 using the transfer matrix model of the device cavity, taking realistic shapes of PH and PL profiles into account (profiles achievable by applied etching chemistry and method). This spectrum is then idealized/improved, by artificially enhancing desired transmission peaks and/or suppressing undesired sideband oscillations or eliminating unwanted peaks.

Then, at 950, the parameters $\lambda_i$, $A_i$ and $p_0$, $p_1$, $p_2$, ... are optimized using, for instance, the Levenberg-Maquard method to closely approximate the idealized transmission or reflection spectra. This is done by comparing the idealized spectrum to that obtained from the transfer matrix calculation of the grating structure resulting from analysis of the function F(x). The function F(x) can be analyzed with additional constraints. For instance, a requirement may be added that the transitions between high- and low-index profiles occur only at uniformly spaced grid nodes. The period, dx, of the grid being much smaller than the smallest length of PH and PL and be compatible with fabrication method smallest address. Other constraints may define the minimum and maximum length of the PH and PL sections.

Alternatively, the optimization of the $\lambda_i$, $A_i$ and $p_0$, $p_1$, $p_2$, ... parameters may be carried out on the basis of maximization of the threshold gain difference of the laser cavity, threshold gain equality (for dual or multimode lasers), longitudinal photon distribution along the cavity or dispersion compensation. For this purpose, different optimization techniques are used as described, for example, in *Numerical recipes in C*, by William H. Press, et al, Cambridge University Press, 1988.

Finally, at 960, the optimized transmission/reflection spectrum is obtained and the corresponding grating data, an alternating sequence of lengths for PH and PL profiles, is stored for subsequent transmission to a suitable e-beam lithography system. The grating pattern can then be reproduced in photo resist on the wafer in an array coincident with the array of DFB devices. The photoresist can then be developed to form the mask for etching the selected profile into the grating layer. The etched grating can be subsequently overgrown with suitable materials and the wafer then processed into waveguide DFB devices.

The present invention has been described with respect to DFB lasers, but is applicable to DBRs, Bragg filters, Bragg reflectors, and other similar optical devices.

This method of grating design is superior in that it allows expanded degrees of freedom in the design space, such that multiple desired characteristics of the final device can be optimized concomitantly. The method allows this to be done with reasonable computational burden, while providing a grating design that is compatible with a wide range of fabrication techniques. For example, it is contemplated that 'ghost stop-bands' may be utilized to minimize secondary reflection peaks in a single peak reflection spectrum, so as to obtain a more stable DFB device. Moreover, the method allows the design of gratings with properties that would otherwise not be possible with prior art methods. For example, DFB lasers with multiple lasing peaks located at arbitrary spectral positions can be readily achieved. Also, although the exemplary method has been described with reference to modulated triangular waves in the iteration function (for fast evaluation), waves defined by any continuously varying periodic function can be used, including sine or cosine waves.

Figure 10A:
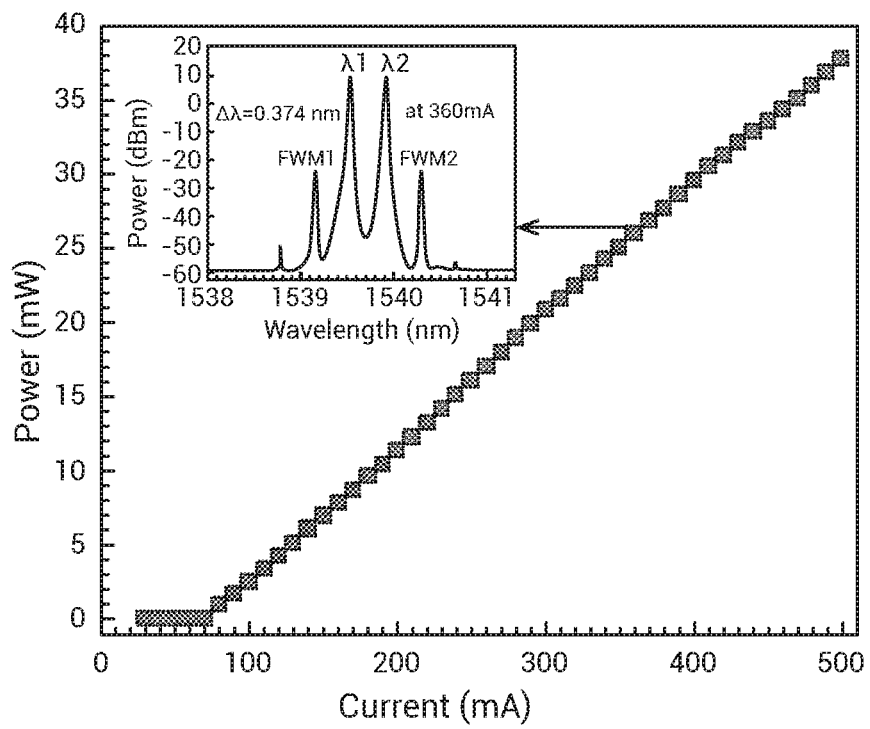
FIG. 10a is a graph showing experimental measurements of power/current for an InAs/InP quantum dash dual-wavelength DFB laser according to an exemplary embodiment, with an inset showing the optical spectrum thereof for a particular frequency and temperature.
Figure 10B:
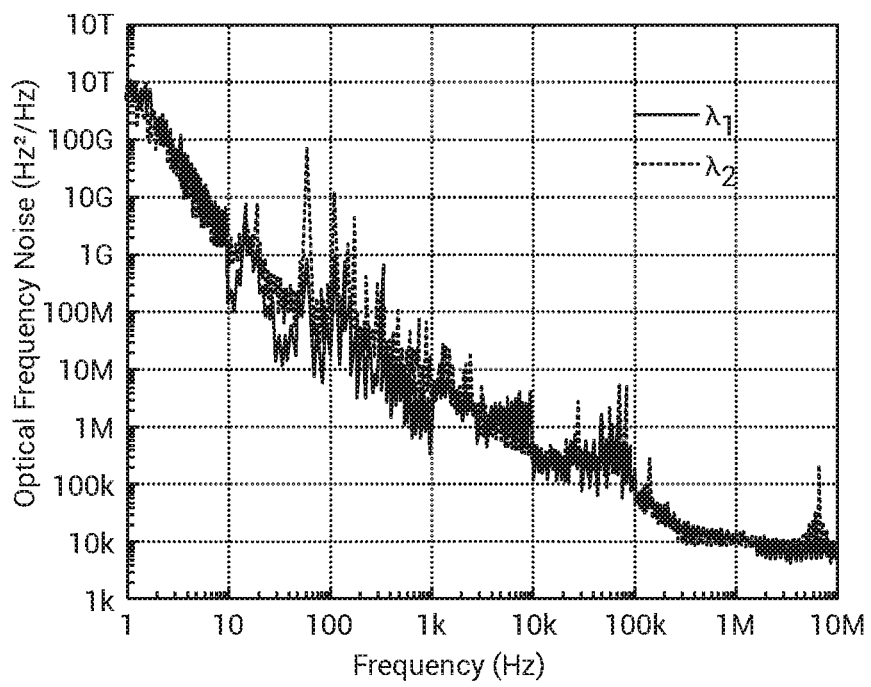
Figure 10C:
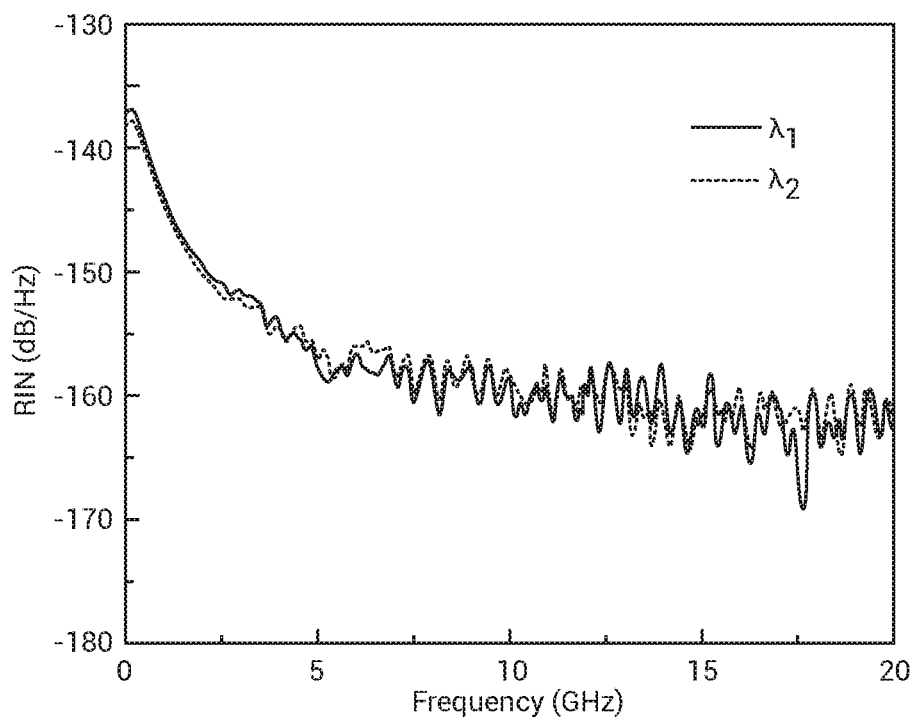
Figure 10D:
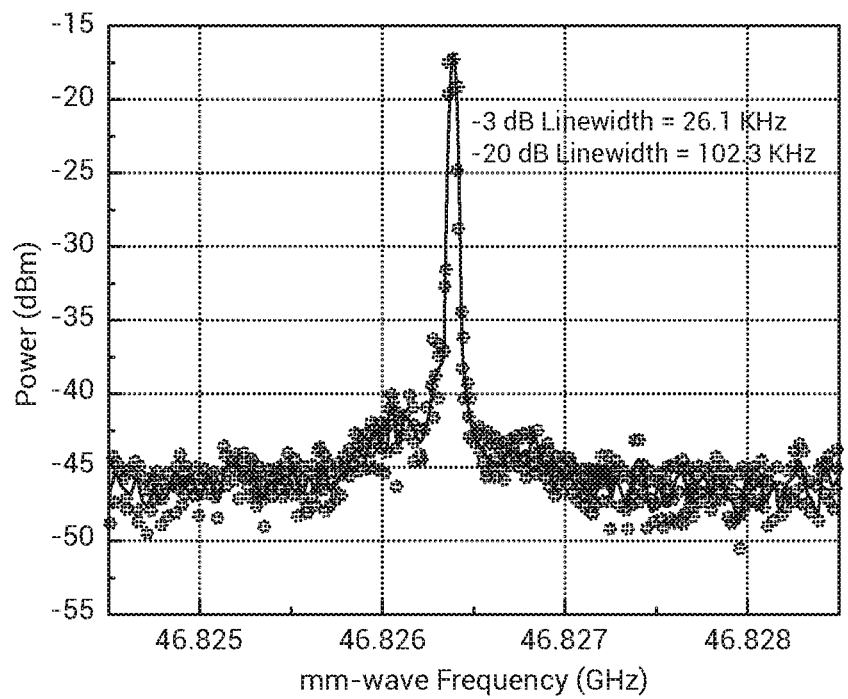

The synthesized aperiodic grating set forth above has been implemented within a fabricated InAs/InP quantum dash dual-wavelength C-band distributed feedback (DFB) laser for generating high performance millimeter-wave (MMW) signals with a frequency range from approximately 10 GHz to approximately 1 THz. FIG. 10*a* shows the measured L-I curve thereof, while the inset shows the optical spectrum at 360 mA and room temperature. It will be noted that the laser threshold current is 70 mA. FIG. 10*b* shows the measured optical phase noise spectra of each individual channel from the fabricated InAs/InP quantum dash dual-wavelength DFB laser of the exemplary embodiment. The corresponding optical linewidth is approximately 16 KHz calculated from the measured phase noise spectra in the frequency range from 1 Hz to 10 MHz. FIG. 10*c* shows the measured optical relative intensity noise (RIN) spectra of each individual channel. The corresponding average RIN is approximately −158 dB/Hz in the frequency range from 10 MHz to 20 GHz. FIG. 10*d* shows the measured mm-wave signal obtained from the beating of the fabricated InAs/InP quantum dash dual-wavelength DFB laser of the exemplary embodiment, with measured −3 dB and −20 dB RF linewidths of the generated mm-wave signal at 46.82639 GHz are 26.1 KHz and 102.3 KHz, respectively and their frequency shift/timing jitters are less than 100 fs.

The many features and advantages of the invention are apparent from the detailed specification and, thus, it is intended by the appended claims to cover all such features and advantages of the invention that fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A method of designing a synthesized aperiodic grating for a waveguide, comprising analyzing an intermediate function, $$F(x) = \sum_i A_i M_i(x) T(\lambda_i, x), i = 0 \ldots N,$$

where
A$_i$ represents the amplitudes,
$\lambda_i$ represents multiple wavelengths,
T($\lambda_i$, x) is a continuously varying periodic function along the waveguide, x, of period $$\Lambda_i = \frac{m\lambda_i}{2n_e},$$

where n$_e$ is the effective index of the waveguide, m is the grating order, and M$_i$(x) are slowly varying amplitude modulation functions, wherein the intermediate function is further formed by
selecting a first plurality of wavelengths $\lambda_i$ having amplitudes approximating unity based on a desired number of dominant Bragg stop-bands in the refection/transmission spectrum;
selecting additional wavelengths $\lambda_i$ and respective amplitudes to suppress unwanted and enhance desired reflection/transmission oscillations on the sides of the dominant Bragg stop-bands;
selecting an etching profile for the grating; and
selecting and parametrizing (p0, p1, p2, ... ) the slowly varying amplitude modulation functions, and
wherein the selected wavelengths, amplitudes and parameters of the slowly varying amplitude modulation function are optimized using known optimization methods 1) to closely approximate the idealized reflection/transmission spectrum of the waveguide, or 2) to achieve at least one of maximum threshold gain difference for single mode lasers and threshold gain equality for dual- or multi-mode lasers, or 3) for desired longitudinal photon distribution along the optical cavity.

2. The method of claim 1, further comprising analyzing the optimized intermediate function F(x) such that wherever there is a continuous span where F( ) is >0, a realistic high index profile is assigned and a realistic low index profile is assigned wherever there is a continuous span where F(x) is <0, thus creating a non-uniform index grating profile;

creating a sequence of lengths of the high index and the low index profiles which constitute the structure of the aperiodic synthesized grating, transferring the said sequence of lengths to the grating layer using e-beam lithography and etching the pattern with said profiles into the grating layer.

3. The method of claim 2 where the function F(x) is optimized and analyzed with additional constraints wherein:

transitions between high- and low-index profiles occur only at uniformly spaced grid nodes and/or the minimum and maximum lengths of the high index and low index sections are set.

4. A distributed feedback (DFB) or distributed Bragg reflector (DBR) laser in which a synthesized aperiodic grating layer providing distributed feedback is designed according to the method of claim 2.

5. A distributed feedback (DFB) or distributed Bragg reflector (DBR) laser in which a synthesized aperiodic grating layer providing distributed feedback is designed according to the method of claim 2 fabricated as a quantum well, quantum dash or quantum dot dual-wavelength/multimode laser for generating high performance millimeter-wave (MMW) signals with a frequency range from approximately 10 GHz to 1 THz.

6. A distributed feedback (DFB) or distributed Bragg reflector (DBR) laser in which a synthesized aperiodic grating layer providing distributed feedback is designed according to the method of claim 3.

7. A distributed feedback (DFB) or distributed Bragg reflector (DBR) laser in which a synthesized aperiodic grating layer providing distributed feedback is designed according to the method of claim 3 fabricated as a quantum well, quantum dash or quantum dot dual-wavelength/multimode laser for generating high performance millimeter-wave (MMW) signals with a frequency range from approximately 10 GHz to 1 THz.

* * * * *